United States Patent
Nichols et al.

(10) Patent No.: US 7,391,001 B2
(45) Date of Patent: Jun. 24, 2008

(54) THIN LIGHTSHIELD PROCESS FOR SOLID-STATE IMAGE SENSORS

(75) Inventors: David N. Nichols, Fairport, NY (US); Eric G. Stevens, Webster, NY (US); Stephen L. Kosman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 307 days.

(21) Appl. No.: 11/068,358

(22) Filed: Feb. 28, 2005

(65) Prior Publication Data

US 2005/0244998 A1 Nov. 3, 2005

Related U.S. Application Data

(62) Division of application No. 10/833,386, filed on Apr. 28, 2004, now Pat. No. 6,878,919.

(51) Int. Cl.
*H01L 21/00* (2006.01)
(52) U.S. Cl. .......................... 250/208.1; 438/57; 438/75
(58) Field of Classification Search ................. 257/222, 257/80, 225, 226, 228, 252, 290; 438/22, 438/24, 48, 57, 75; 250/208.1
See application file for complete search history.

(56) References Cited

U.S. PATENT DOCUMENTS

| 5,719,075 | A | * | 2/1998 | Hawkins et al. | 438/75 |
| 5,846,708 | A | * | 12/1998 | Hollis et al. | 506/12 |
| 6,130,156 | A | | 10/2000 | Havemann et al. | |
| 6,627,866 | B2 | | 9/2003 | Hula et al. | |
| 6,867,062 | B2 | * | 3/2005 | Stevens | 438/57 |
| 2003/0001222 | A1 | * | 1/2003 | Street et al. | 257/444 |

* cited by examiner

*Primary Examiner*—Georgia Y. Epps
*Assistant Examiner*—Tony Ko
(74) *Attorney, Agent, or Firm*—Peyton Watkins

(57) ABSTRACT

An image sensor includes a substrate having photosensitive areas; an insulator spanning the substrate; and a first and second layer of a multi-layer metallization structure, wherein the first layer forms light shield regions over selected portions of the photosensitive area as well forming circuit interconnections and barrier regions to prevent spiking into the substrate or gates at contacts in the non-imaging area; and the second layer spanning the interconnections and barrier regions of the first layer only over the non-imaging areas and the second layer overlays edges of the first layer.

6 Claims, 2 Drawing Sheets

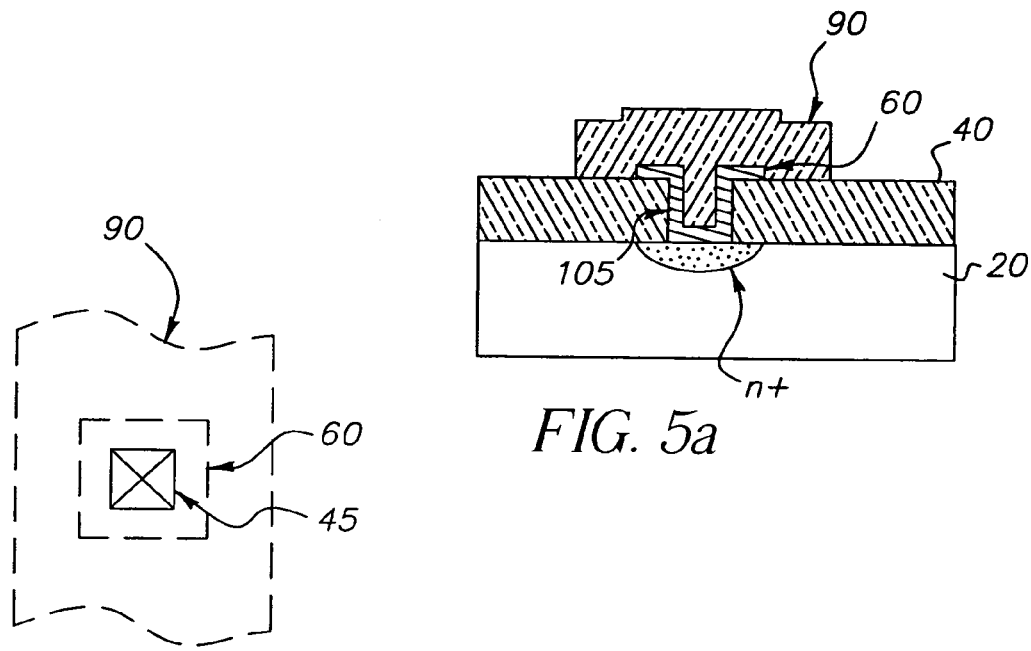
FIG. 5a
FIG. 5b
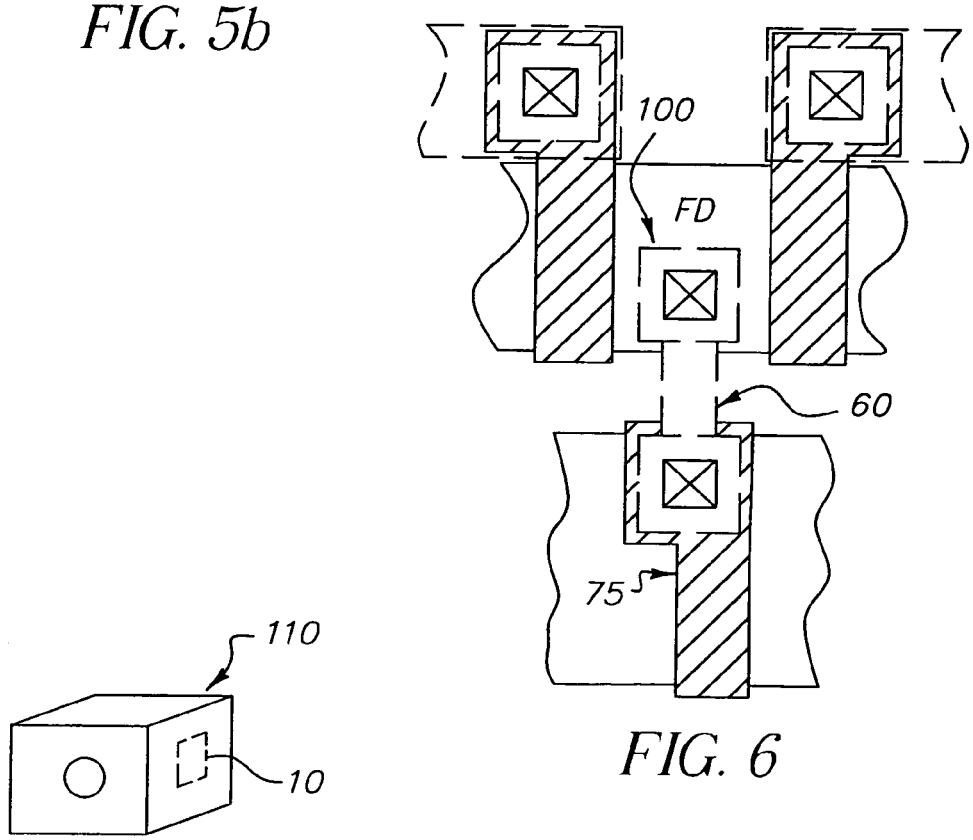
FIG. 6
FIG. 7

THIN LIGHTSHIELD PROCESS FOR SOLID-STATE IMAGE SENSORS

CROSS-REFERENCE TO RELATED APPLICATIONS

This is a divisional of application Ser. No. 10/833,386, filed Apr. 28, 2004 now U.S. Pat. No. 6,878,919.

FIELD OF THE INVENTION

The invention relates generally to the field of solid-state image sensors, and more particularly to the process of forming a lightshield and the interconnection layers for a solid-state image sensor.

BACKGROUND OF THE INVENTION

Image sensors are made of an array of pixels. Within each pixel, some regions are specifically designed to be photosensitive, and other regions are protected from light by a lightshield. Regions are protected from light because light absorbed in these protected regions causes degraded performance through mechanisms such as color crosstalk, smear, or reduced blooming control.

In U.S. patent application Ser. No. 10/641,724, filed Aug. 15, 2003, entitled "Light Shield Process For Solid-State Image Sensors," by Eric G. Stevens, a thin lightshield process is described for providing a lightshield from one of the layers of a bi-layer metallization process. The aluminum layer in this process is usually patterned with a chlorine-based plasma chemistry which leaves chlorine-containing residue on the wafers after the etch. Further, this residue may react with the aluminum or TiW, especially where the aluminum and TiW meet, causing corrosion of these films, and degradation of their electrical properties or optical light-shielding properties. In addition, U.S. patent application Ser. No. 10/641,724 requires that the etch of the bottom layer of the bi-layer metal be masked in some regions by the top layer of the bi-layer metallization. This requirement may restrict the use of certain metals for the bi-layer metallization.

Consequently, a need exists for producing image sensors that overcome the above-described drawbacks.

SUMMARY OF THE INVENTION

The present invention is directed at overcoming the problems described above. The invention resides in an image sensor comprising (a) a substrate having photosensitive areas; (b) an insulator spanning the substrate; and (c) a first and second layer of a multi-layer metallization structure, wherein the first layer forms light shield regions over selected portions of the photosensitive area as well forming circuit interconnections and barrier regions to prevent spiking into the substrate or gates at contacts in the non-imaging area; and the second layer spanning the interconnections and barrier regions of the first layer only over the non-imaging areas and the second layer overlays edges of the first layer.

The above and other objects of the present invention will become more apparent when taken in conjunction with the following description and drawings wherein identical reference numerals have been used, where possible, to designate identical elements that are common to the figures.

Advantageous Effect of the Invention

The present invention has the advantage of a thin lightshield and an interconnect metallization layer using a process that minimizes corrosion of the aluminum and TiW layers. A second advantage is that the patterned second layer of a bi-layer metallization is not used as a mask for the etch of the first layer of the bi-layer metallization.

BRIEF DESCRIPTION OF THE DRAWINGS

FIGS. 5a and 5b are an alternative embodiment of the present invention;

FIG. 6 is also an alternative embodiment of the present invention; and

FIG. 7 is a perspective view of a digital camera for illustrating a typical commercial embodiment to which the ordinary consumer is accustomed.

DETAILED DESCRIPTION OF THE INVENTION

Figure 1:
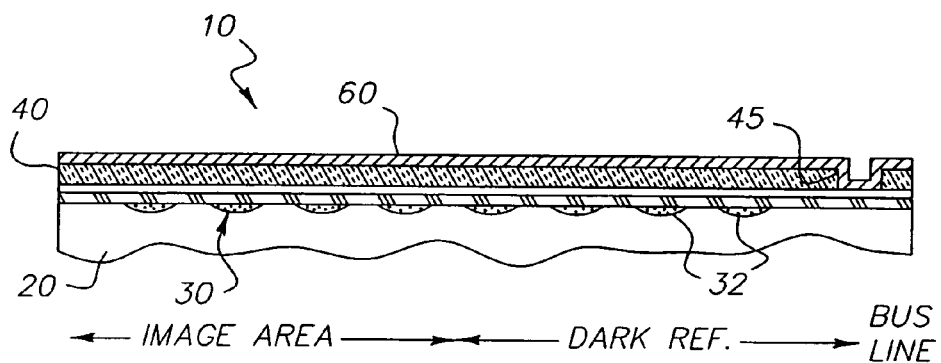
FIG. 1 is a side view in cross section of an image sensor of the present invention illustrating initial steps in producing the image sensor.

Referring to FIG. 1, a typical image sensor 10 consists of an array of photosensitive elements or pixels 30 in an image area. Within each pixel are regions that are exposed to light so that an electrical signal may be created in response to the incident light. In addition, there are regions within the pixel, which are prevented from receiving light because the light will degrade the imaging performance. A typical image sensor 10 also provides dark reference pixels 32 that are insensitive to light because they are covered with a light shield.

The signal from these dark reference pixels 32 are used in the signal processing portion of the camera to indicate the signal of photosensitive pixels when no light is incident upon them. In addition, interconnects are provided within the image sensor to electrically connect various parts of the imager and to provide means to connect the imager to external circuits.

Referring to FIG. 1, there is shown an initial stage of forming an image sensor 10 of the present invention. This stage includes providing a substrate 20 having a plurality of photosensitive sites 30 that convert incident light into charge packets. An insulator 40 spans and covers the substrate 20 and includes an opening 45 therethrough for forming a contact hole, and the first layer 60 of a bi-layer metallization structure is deposited on the insulator 40. In the preferred embodiment, the first layer of the bi-layer metallization is a titanium and tungsten alloy, and a bi-layer metallization is described. However other metals or combination of metals and/or their compounds can be used. The important properties of this first layer are that it is opaque in order to be used as a light shield, and that the metal can be used as part of a bi-layer metallization process where this first layer provides a barrier preventing the interaction of the silicon substrate with the upper and more conductive layer. Other first layers may be tungsten, or tungsten silicide, or molybdenum, or molybdenum silicide. Photoresist is selectively disposed on the TiW layer (not shown) to form a mask to prevent the etching of the underlying TiW layer. The exposed regions of the TiW layer are then etched using a fluorine-based plasma etchant.

Figure 2:
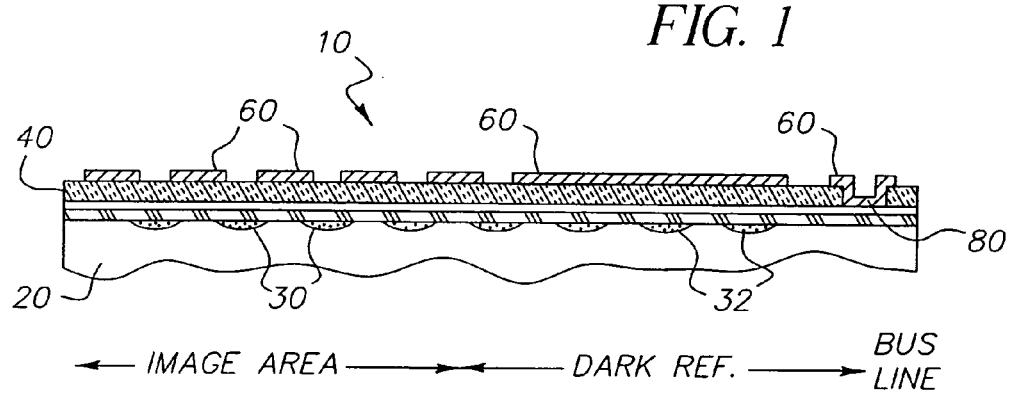
FIG. 2 is a drawing illustrating a step in the manufacturing process after FIG. 1.

Referring to FIG. 2, there is shown the resulting cross-section after the selective etching of the titanium and tungsten alloy layer 60, and the removal of the photoresist. The titanium and tungsten alloy 60 covers those regions of the pixel that should not be exposed to light for forming a light shield. The titanium and tungsten alloy 60 may also cover dark reference pixels 32. In addition, the titanium and tungsten alloy 60 remains where metallization interconnects and bus lines, generally region 80, are to be provided. The present invention includes the capability to separately pattern the titanium and tungsten alloy 60 so that it may be used as a local interconnect to electrically connect different parts of the imager that are not required to conduct high current levels, or to connect parts of the imager that are very close to each other, or other instances where the high conductivity of aluminum is not required. This local interconnect has the advantage of lower capacitive coupling to other parts of the imager and its circuitry because the total interconnect height is less than the bi-layer metallization. An example is shown in FIG. 6. An aluminum layer 90 (see FIG. 4) will be used in combination with the titanium and tungsten alloy 60 as the interconnect for other circuits elements, as will be described hereinbelow. A floating diffusion 100 is connected via the titanium and tungsten alloy 60 to a gate of a transistor 75 that forms a portion of an image sensor output structure.

Figure 3:
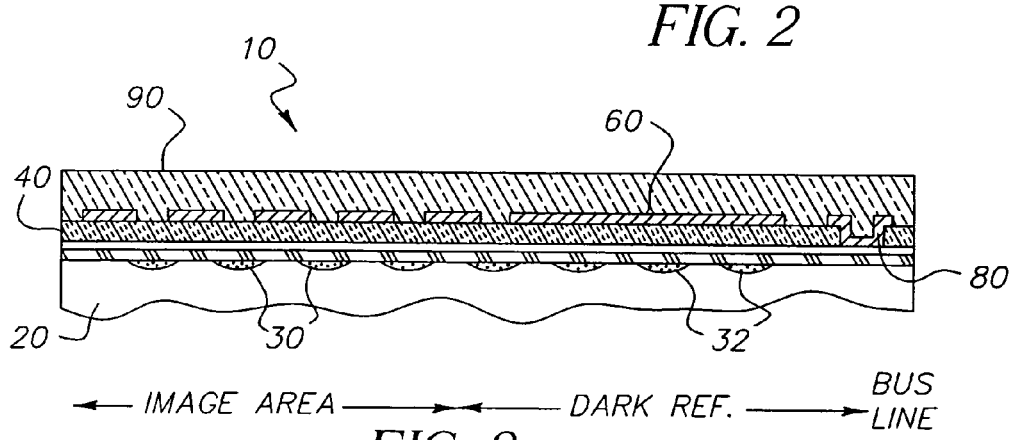
FIG. 3 is a drawing illustrating a step in the manufacturing process after FIG. 2.

Referring to FIG. 3, after patterning the titanium and tungsten alloy 60, a layer of aluminum or alloy of aluminum 90 such as an alloy of aluminum and silicon, or an alloy of aluminum, silicon, and copper is deposited. This aluminum alloy layer 90 covers the patterned titanium and tungsten alloy 60 and the insulator 40 where the titanium and tungsten alloy 60 have been removed. It is noted for clarity that the combination of the titanium and tungsten alloy 60 and the aluminum 90 form the bus line 80.

Figure 4:
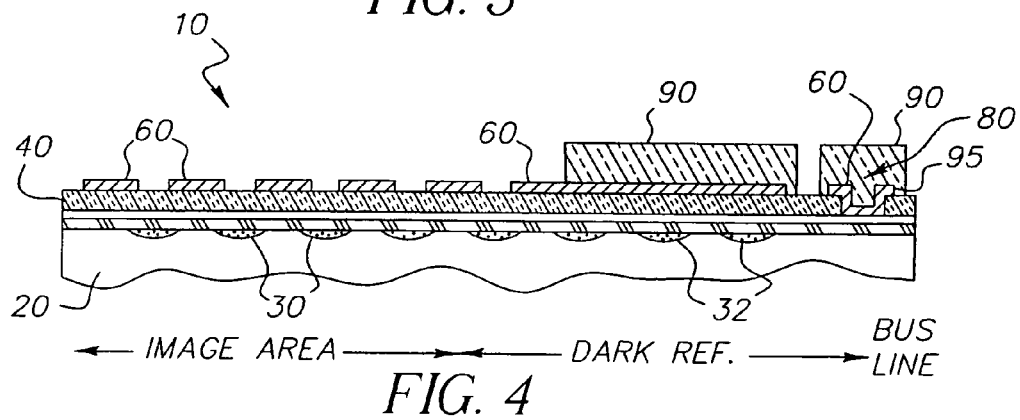
FIG. 4 is a drawing illustrating a step in the manufacturing process after FIG. 3.

Referring to FIG. 4, next, photoresist is selectively disposed spanning and covering the aluminum alloy layer 90 that is in the non-imaging areas, such as the dark reference pixels 32, and the interconnect region or bus line 80. This photoresist then masks a chlorine-based etch of the aluminum alloy layer 90. The chlorine-based plasma etch selectively etches aluminum layer 90, but does not etch the titanium and tungsten alloy 60, nor the insulator 40. The photoresist is then removed. The aluminum alloy 90 no longer covers the imaging area or photosensitive site 30. The aluminum 90 does cover the titanium and tungsten alloy 60 over interconnect region 80, and therefore forms the bi-metal interconnect wiring used for bus lines and other electrical connections. In the bi-layer structure, the aluminum alloy 90 can cover both the top and the sides of the titanium and tungsten alloy 60 so that corrosion of the interconnect wiring is minimized. In particular, it is noted that the aluminum alloy covers the edges 95 of the titanium and tungsten alloy 60. The aluminum alloy 90 may also be patterned to cover the light shielded dark reference pixels 32 with or without the underlying titanium and tungsten alloy layer 60 if the titanium and tungsten alloy layer 60 does not provide sufficient opacity in this region. The aluminum alloy 90 does not cover the local interconnections made with the titanium and tungsten alloy 60 only. For clarity of understanding, it is noted that the titanium and tungsten alloy 60 form a barrier region to prevent intermixing between the gate region and the aluminum layer 90 and to prevent intermixing of source and drain regions with the aluminum layer 90. The remaining steps needed for completion of a commercially usable image sensor are well known in the art and need not and will not be discussed in detail herein.

A second embodiment provides the same advantages, but instead of a continuous bi-layer metallization, the titanium and tungsten alloy 60 is patterned so that it is placed only in the contact holes and an overlap around the contact holes. The overlap of the contact holes ensures that the contact hole is completely covered by the titanium and tungsten layer within alignment variations of the process. The aluminum alloy alone is used for the interconnect layer in regions away from the contact hole. In this embodiment, the conductivity of the interconnect is about the same as the first embodiment, and junction spiking and electromigration at the contact holes is prevented by the barrier layer (the titanium and tungsten alloy), but reduces the thickness of the metallization interconnect over much of the device. FIGS. 5a and 5b show an example where the titanium and tungsten alloy 60 are patterned to cover only the contact hole 105, while the aluminum alloy 90 alone is used in regions away from the contact hole 105.

Referring to FIG. 7, there is shown an electronic device, such as a digital camera 110, for illustrating a typical commercial embodiment for the image sensor 10 of the present invention.

The invention has been described with reference to a preferred embodiment. However, it will be appreciated that variations and modifications can be effected by a person of ordinary skill in the art without departing from the scope of the invention.

PARTS LIST 10 image sensor
20 substrate
30 photosensitive elements (image area) or pixels
32 dark reference pixels
40 insulator
45 opening
60 titanium and tungsten alloy layer (1$^{st}$ layer)
75 transistor
80 interconnect region or bus line
90 aluminum alloy layer
95 edges
100 floating diffusion
105 contact hole
110 digital camera

The invention claimed is:

1. An image sensor comprising:
   (a) a substrate having a plurality of photosensitive areas;
   (b) an insulator spanning the substrate;
   (c) a first layer of a multi-layer metallization structure spanning at least a portion of the insulator; wherein the first layer forms a lightshield or interconnect; and
   (d) a second layer of a multi-layer metallization structure spanning at least portions of the first layer and extending over one or more edges of the first layer such that the one or more edges are covered by the second layer.

2. The image sensor as in claim 1, wherein the first layer is titanium and tungsten, and the second layer is aluminum.

3. The image sensor as in claim 1, wherein the first layer is patterned to reside only in one or more contact holes formed in the insulator and extend over and overlap only a portion of the insulator immediately adjacent the one or more contact holes.

4. A digital camera comprising:
   an image sensor comprising:
      (a) a substrate having a plurality of photosensitive areas;
      (b) an insulator spanning the substrate;
      (c) a first layer of a multi-layer metallization structure spanning at least a portion of the insulator; wherein the first layer forms a lightshield or interconnect; and (d) a second layer of a multi-layer metallization structure spanning at least portions of the first layer and extending over one or more edges of the first layer such that the one or more edges are covered by the second layer.

5. The digital camera as in claim 4, wherein the first layer is titanium and tungsten, and the second layer is aluminum.

6. The The digital camera as in claim 4, wherein the first layer is patterned to reside only in one or more contact holes formed in the insulator and extend over and overlap only a portion of the insulator immediately adjacent the one or more contact holes.

* * * * *